US009231358B1

(12) United States Patent
Schow et al.

(10) Patent No.: US 9,231,358 B1
(45) Date of Patent: Jan. 5, 2016

(54) CAPTIVE CABLE HOLDER FOR POWER DISTRIBUTION UNIT SERVICEABILITY (71) Applicant: Amazon Technologies, Inc., Reno, NV (US)

(72) Inventors: Kenneth Michael Schow, Seattle, WA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 157 days.

(21) Appl. No.: 13/964,879

(22) Filed: Aug. 12, 2013

(51) Int. Cl.
H02G 1/00 (2006.01)
H01R 13/62 (2006.01)
H01R 33/88 (2006.01)
H01R 43/00 (2006.01)

(52) U.S. Cl.
CPC ............... H01R 33/88 (2013.01); H01R 43/00 (2013.01)

(58) Field of Classification Search
CPC ............ H02G 1/00; H02G 3/00; H02G 3/02; H02G 3/0616; H02G 3/0625; H02G 3/22; H02G 3/26; H02G 3/28; H02G 3/30; H02G 15/00; H02G 15/007; H01R 25/00; H01R 13/62; H01R 13/62977; H01R 13/6335; H01R 33/88; H01R 43/00
USPC ........... 174/53, 72 A, 68.1, 68.3, 40 CC, 480, 174/494, 73.1, 74 R, 135; 439/372, 373, 439/296, 344, 581, 638, 144, 160, 157; 385/134, 135; 248/68.1, 49, 74.1, 74.2
See application file for complete search history.

(56) References Cited

U.S. PATENT DOCUMENTS

| 2,266,560 | A  | * | 12/1941 | Mansfield Irving | .......... 439/373 |
| 3,801,757 | A  | * | 4/1974  | Carissimi et al. | ............. 439/157 |
| 4,455,715 | A  |   | 6/1984  | Matsui | |
| 4,509,710 | A  |   | 4/1985  | Cooper et al. | |
| 4,669,688 | A  |   | 6/1987  | Itoh et al. | |
| 4,679,123 | A  | * | 7/1987  | Young | .......... 174/72 A |
| 4,784,610 | A  | * | 11/1988 | Stuart | ............. 439/160 |
| 7,116,550 | B2 | * | 10/2006 | Ewing et al. | ............. 174/50 |
| 7,223,918 | B2 |   | 5/2007  | Gelibert | |
| 7,374,447 | B2 | * | 5/2008  | Matsumoto | ................. 439/344 |
| 7,429,701 | B1 | * | 9/2008  | Kushnir et al. | ............... 174/53 |
| 7,766,696 | B2 | * | 8/2010  | Conner et al. | ............. 439/581 |
| 7,903,922 | B2 | * | 3/2011  | Momotsu et al. | ........... 385/135 |
| 7,976,346 | B2 | * | 7/2011  | Guy et al. | ................. 439/638 |
| 2008/0076291 | A1 | * | 3/2008 | Ewing et al. | ................. 439/373 |

* cited by examiner

Primary Examiner — Angel R Estrada
(74) Attorney, Agent, or Firm — Robert C. Kowert; Meyertons, Hood, Kivlin, Kowert & Goetzel, P.C.

(57) ABSTRACT

A power cable holder includes a holder body and power cable-holding portions. The power cable-holding portions couple with one or more cables. The cable-holding portions hold power plugs on the cables in a predetermined spacing and order with respect to one another. A power connector plug extraction mechanism may be operable by a user to extract the power connector plugs from corresponding power connector receptacles in a power distribution unit.

20 Claims, 6 Drawing Sheets

CAPTIVE CABLE HOLDER FOR POWER DISTRIBUTION UNIT SERVICEABILITY

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

In some computer systems, one or more rack-level power distribution units are provided in a rack to distribute electrical power to the many servers in the rack. Each of the rack-level power distribution units may include a case with a large number of receptacles, each of which may be used to supply power to a different server, and a built-in input power cable that passes out of the case. Rack-level power distribution units may be attached to one or both interior sides of the rack near one end of the rack.

From time to time, rack PDUs operating in a data center may fail and need to be replaced. Removing a rack PDU may involve disconnecting a power input cable from a power source and feeding the power input cable into the rack (for example, through the bottom of the rack and false floor). Installing the replacement rack PDU may involve feeding the new power input cable back through and connecting to the power source.

In data centers, a significant number of power connections may be required from each rack PDUS to numerous server in the rack. If the rack PDU needs to be removed and serviced or replaced, service personnel may have to go through a time-consuming and laborious process of disconnecting each of numerous connections so that the rack PDU can be removed, and then, after the rack PDU is removed, go through another time-consuming and laborious process of reconnecting each of the power cable plugs to the rack PDU. In many cases, the power cable plugs to be reinstalled are out of order. Also, because of the number of connections, in cases where each of the servers is assigned to a particular receptacle or group of receptacles of the rack PDU, there is the possibility that an error may be made during the reconnection process. For example, service personnel may incorrectly switch two of the plugs, with the result that some of the plugs are installed in the wrong receptacles.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of methods and apparatus for systems and methods for managing cable connections are described. According to one embodiment, a system includes one or more power cables and one or more power cable holders coupled to the power cables. Power connector plugs on the power cables may be coupled to corresponding power connector receptacles of a power distribution unit. The power cable holders include power cable-holding portions that hold the power connector plugs in a predetermined spacing from one another. A power connector plug extraction mechanism is operable by a user to extract the power connector plugs from corresponding power connector receptacles in the power distribution unit.

According to one embodiment, a power cable holder includes a holder body and power cable-holding portions. The power cable-holding portions couple with one or more cables. The cable-holding portions hold power plugs on the cables in a predetermined spacing and order with respect to one another.

According to one embodiment, a method of managing power connections includes disconnecting power connector plugs on a set of power cables from a set of power connector receptacles. The power connector plugs are maintained in the predetermined spatial arrangement after the power connector plugs are disconnected from the set of power connector receptacles.

As used herein, a "cable" includes any cable, conduit, or line that carries one or more conductors and that is flexible over at least a portion of its length. A cable may include a connector portion, such as a plug, at one or more of its ends.

As used herein, "holder" means any element or combination of elements that holds another element or elements. Examples of holders include a clamp, a clip, or a clasp.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "plug" of a connector means any element or device on a cable that can be used to electrically or optically connect the cable with another device or element.

As used herein, a "rack" means a rack, container, frame, or other element or combination of elements that can contain or physically support one or more computing devices.

As used herein "rack-level", as applied to a component or system, means the component or system serves electrical systems in a particular rack.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, a "release element" means an element, or combination thereof, that can be operated (for example, actuated, turned, pushed, or pulled) to release a device or component. For example, a connector plug may include a release tab that is depressed to unlatch the connector plug from a receptacle in which it is installed.

In some embodiments, a clamp couples to power cable plugs at or near a connection of the cables to a receptacle panel of an electrical device. In one embodiment, the electrical device is a rack power distribution unit. Service personnel may unplug bunches of cables at a time and keep them captive within the group, labeled, and in order for replacement. In some embodiments, a cable holder is installed by a rack integrator to maximize the serviceability of in-bound racks to a data center.

In some embodiments, a cable holder holds cables connected to an electrical device, such as a rack power distribution unit. The cable holder can hold connector plugs on the cable in an arrangement that matches the order, spacing, and arrangement of mating connector receptacles on the electrical device.

Figure 1:
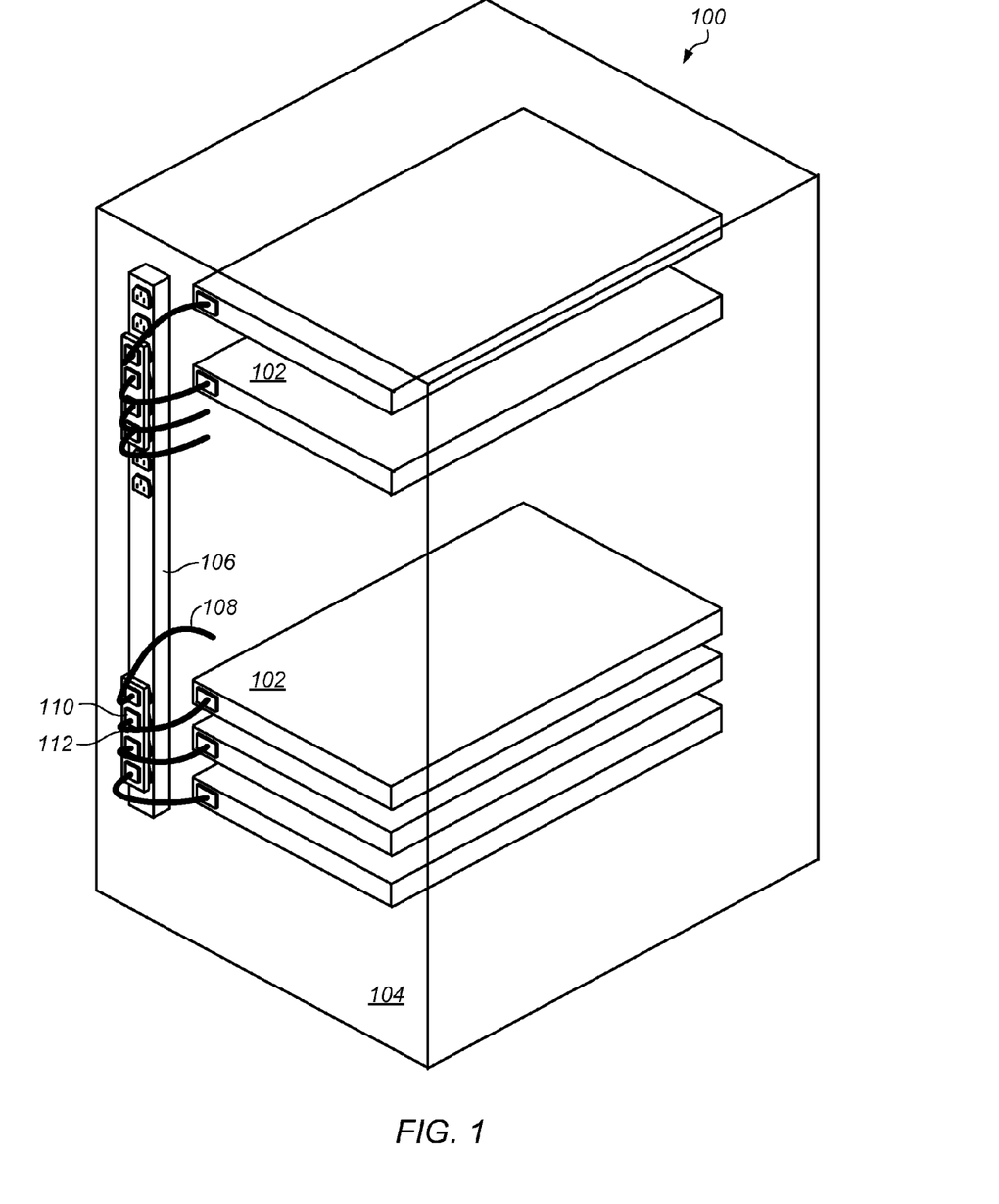
FIG. 1 illustrates one embodiment of a system with power cable holders for rack PDU connections.

FIG. 1 illustrates one embodiment of a system with power cable holders for rack power distribution unit connections. System 100 includes servers 102 in rack 104. Servers 102 receive power from rack power distribution unit 106 by way of power cables 108. Each of power cables 108 includes power plug 110.

Holders 112 are attached to power cables 108. Each holder 112 in the system may be attached to a different group of cables. Holders 112 may be used to hold groups of cables in a spatial arrangement to one another. In some embodiments, holders maintain a group of cable plugs in a spatial arrangement during maintenance operations, such as replacement of one of rack power distribution units 106.

In some embodiments, connector plugs on each of cables 108 are labeled with an identifier. Service personnel can use the identifier to match the cable with the correct receptacle on rack power distribution unit 106.

Cable holders 112 are installed on cables 108. In some embodiments, cable holders are installed on cables in a rack before the rack has been placed into service. In other embodiments, cable holders are installed on cables in a rack after the rack has been placed into service. In some embodiments, cable holders 112 are installed on cables connected to rack power distribution unit 106 before rack power distribution unit 106 is to be removed for repair or replacement.

In the embodiment shown in FIG. 1, each of cable holders 112 groups and arranges four of cables 108 to be installed on rack power distribution unit 106. A cable holder may nevertheless in various embodiments group and spatially arrange any number of cables. For example, a cable holder may arrange two cables, 8 cables, or 12 cables.

The number of cables grouped on a cable holder may vary from embodiment to embodiment. For example, there may be four groups of eight for receptacles. The top and bottom of each cable section may be labeled to match a corresponding port on the switch.

In certain embodiments, a foam or other pliable material based holder (for example, a clamp) fits under or over the cables that are plugged into a switch. The clamp may be installed just outside of the actual connector to allow removal access and keep the cables captive in groups.

Figure 2:
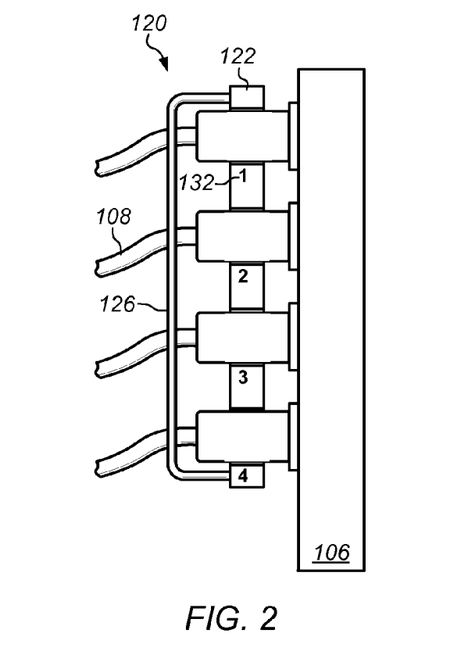
FIG. 2 illustrates one embodiment of a power cable holder with a handle for inserting and extracting cable from a rack power distribution unit.

FIG. 2 illustrates one embodiment of a power cable holder with a handle for inserting and extracting cable from a rack power distribution unit. Power cable holder 120 includes cable holder body 122, slots 124, and handle 126. Power cables 108 may be inserted in slots 124. Power plugs 110 may rest in cavities in slots 124. In some embodiments, slots 124 include a seat for the plug that constrains motion of the plug (for example, forward or rearward relative to the rack power distribution unit. In certain embodiments, the portion of cable holder body 122 around slot 124 is resilient, such that connector plugs 110 remain in place. In one embodiment, each power plug snaps into place in a corresponding slot in cable holder body 122. Cable holder body 122 may rigid, such that the spacing between adjacent power plugs 110 is fixed. Handle 126 may be grasped by a user to install or remove cables from rack power distribution unit 106. In certain embodiments, the spacing between two or more of the slots is adjustable by a user. For example, the holder may include two or more segments that slide with respect to one another.

Cable holder 120 may be made of a pliable material, such as foam or rubber. The cable jacket of cable 108 may press or snap into slots 124 on cable holder 120.

In certain embodiments, a cable holder may be connected to a cable such that a gap exists between the cable holder and the connector plugs. A gap between the connector plugs and the cable holder may allow some freedom in the position of the connector plugs relative to one another. Freedom of movement of cable connector plugs may allow for some adjustment to accommodate variations in spacing on a receptacle panel in which the connector plugs are to be installed. In some embodiments, the position of the cable holder can be adjusted relative to the connector plugs. For example, the cable holder may slide up and down on the cable jacket to increase or decrease the spacing between the connector plug and the cable holder. In certain embodiments, a cable holder may be in contact with a strain relief of a connector plug.

In the embodiment shown in FIG. 2, cable holder 120 has an open side. Cables may be held in place in cable holder 120 by the resilient characteristics of slots 124. A cable holder may, nevertheless, in some embodiments include a cover, clips, notches, or other members or elements to retain or fix cables in position. In one embodiment, a cable holder includes a pair of opposing clamping members (for example, top and bottom) that form a clamshell for the cables to be held in.

In some embodiments, slots of a cable holder include a detent mechanism that inhibits separation of a cable to a holder. Once cables 110 are pressed into slots 124, separation of cables 110 from slots 124 may be inhibited by the detent mechanism.

Labels 132 may be used to identify the position of the cables in the cable holder. In some embodiments, labels 132 are used to match cable connector plugs to a corresponding connector receptacle in a panel (for example, the slot for cable 16 may be marked with the number 16, the slot for cable 17 may be marked with the number 17, and so on.) In some embodiments, cables are placed in numbered slots so that they are in an order corresponding to the receptacles in a rack power distribution unit.

Figure 3A:
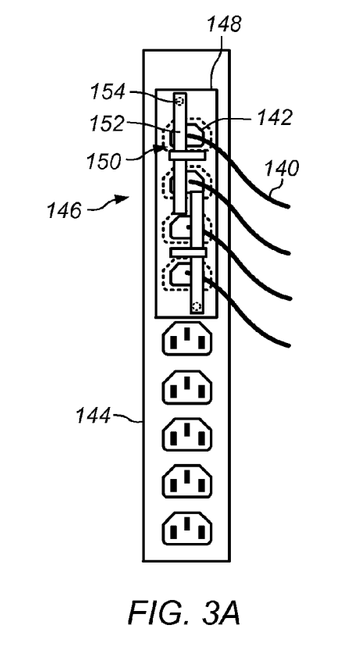
FIG. 3A illustrates a front view of one embodiment of a cable holder for a set of power cables installed in a rack power distribution unit.
Figure 3B:
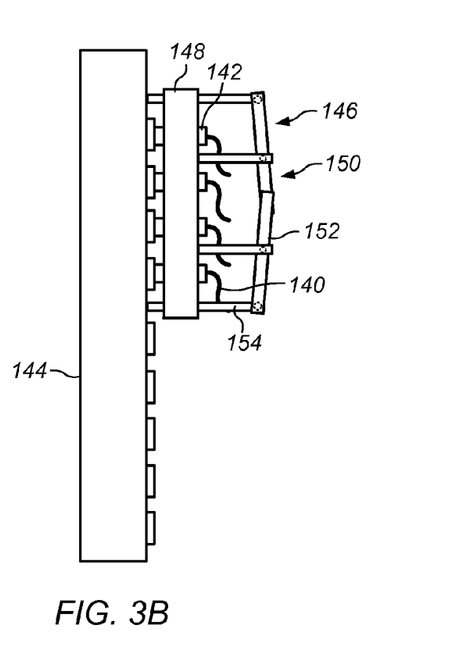
FIG. 3B illustrates a side view of one embodiment of a cable holder for a set of power cables installed in a rack power distribution unit.

In some embodiments, a power cable holder includes a mechanism for extracting or inserting cable plugs into a set of receptacles. FIG. 3A illustrates a front view of one embodiment of a cable holder for a set of power cables installed in a rack power distribution unit. FIG. 3B illustrates a side view of the cable holder shown in FIG. 3A. Cables 140 include connector plugs 142. Connector plugs 142 are installed in rack PDU 144. Cable holder 146 includes holder body 148 and release mechanism 150. Release mechanism 150 includes levers 152 and pins 154. Pins 154 may slide in corresponding holes or sleeves in holder body 148. Levers 152 may be moved to push pins 154 against rack PDU 144 to extract connector plugs 142 from rack PDU 144.

Figure 4A:
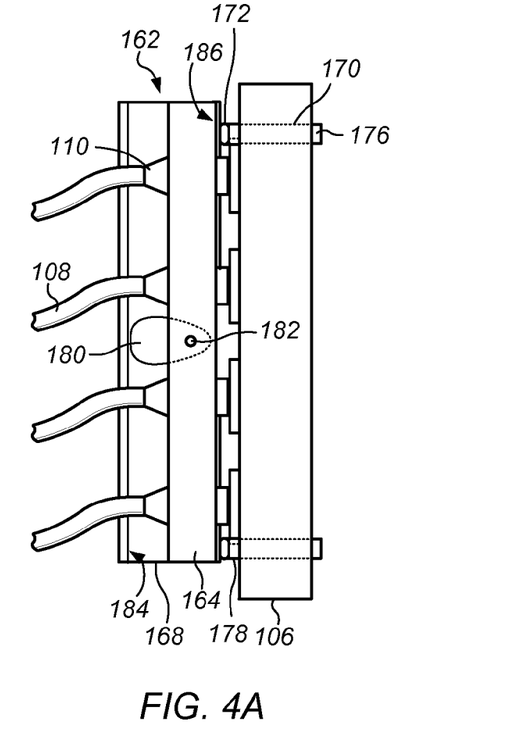
FIGS. 4A and 4B illustrate one embodiment of a power cable holder system with a plug insertion/extraction mechanism.
Figure 4B:
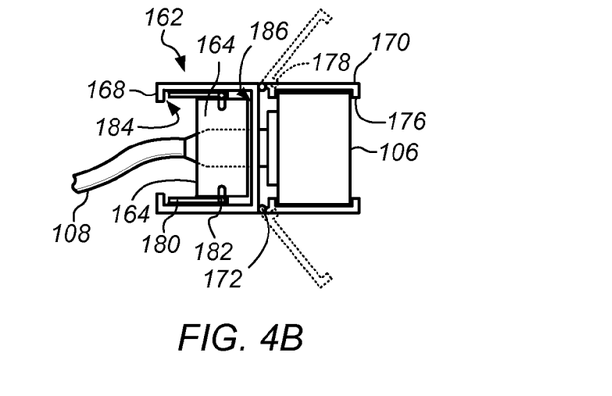

FIGS. 4A and 4B illustrate one embodiment of a power cable holder system with a PDU insertion/extraction mechanism. Cable holder system 160 includes bracket assembly 162, cable carrier 164, and insertion/extraction device 166. Power cables 108 including power plugs 110 may be installed in each slot in cable carrier 164.

Bracket assembly 162 includes rail members 168 and rack PDU engaging members 170. Rack PDU engaging members 170 may swing on hinges 172 to engage rack PDU housing 174. Rim 176 of rack PDU engaging members 170 may engage the rear side of rack PDU housing 174. Rim 178 of rack PDU engaging members 170 may engage the rear side of rack PDU housing 174.

Insertion/extraction device 166 includes cam member 180. Cam member 180 may rotate on pin 182 coupled to carrier 164. To insert power plugs into rack PDU 106, a user may turn cam members 180 to engage on rear rails 184 of rail members 168. Engagement of cam member 180 on rear rails 184 may apply an insertion force on power plugs 110. In some embodiments, cam member is connected to a handle, knob, or lever. In some embodiments, a cam member can be operated to lock set of power plugs in a set of receptacles.

To extract power plugs from rack power distribution unit 106, a user may turn cam members 180 to engage on forward rails 184 of rail members 168. Engagement of cam member 180 on forward rails 186 may apply an extraction force on power plugs 110.

In certain embodiments, a release mechanism actuating a release element of a connector. For example, a release mechanism a cable holder may pull on a tab, or depress or lift a release loop of the connector plug.

In some embodiments, connector plugs grouped on a cable holder are installed and released sequentially from connector receptacles on an electrical device. In other embodiments, connector plugs grouped on a cable holder are installed and released simultaneously.

In some embodiments, a cable holding system includes a mechanism for individually extracting or inserting cable plugs on the holder. Each plug on the holder may be extracted from its corresponding receptacle sequentially (for example, top to bottom). In certain embodiments, a user can move an extraction mechanism from one position to another along the length of a holder to extract plugs on the holder, one after another, from a set of receptacles (for example, power receptacles on a rack PDU). In some embodiments, a cable holder is flexible so that the cable holder can be used to sequentially disconnect and withdraw connector plugs on the cable holder.

Figure 5A:
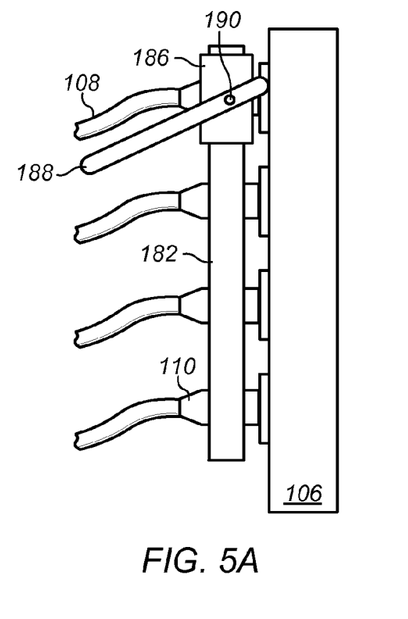
FIGS. 5A and 5B illustrate one embodiment of a cable holder with a pliable body and a sliding plug extraction mechanism.
Figure 5B:
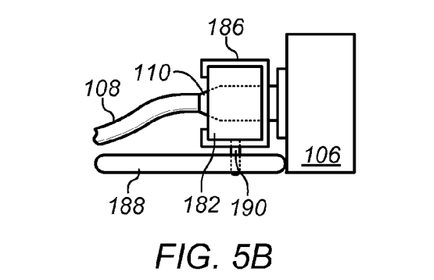

FIGS. 5A and 5B illustrate one embodiment of a cable holder with a pliable body and a sliding plug extraction mechanism. Cable holding system 180 includes holder bar 182 and extraction device 184. Power cables 108 including power plugs 110 may be installed in slots in holder bar 182.

Extraction device 184 includes slider 186 and extraction lever 188. Slider 186 may slide along holder bar 182. Extraction lever 188 is connected to slider 186 by way of pin 190. Lever may be actuated by a user to bear against rack PDU 106.

Figure 6A:
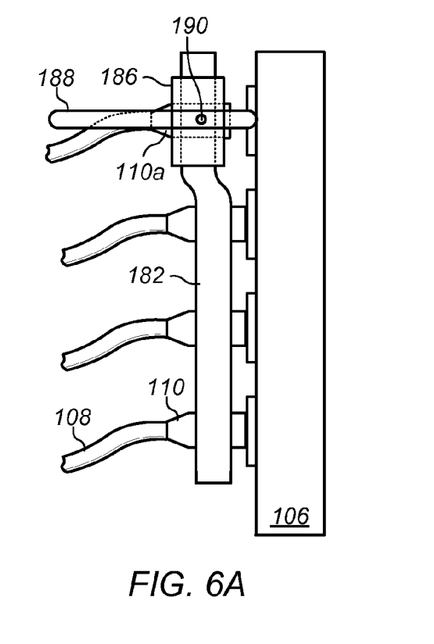
FIGS. 6A and 6B illustrate operation of a sliding plug extraction mechanism to extract one plug on a cable holder from a rack power distribution unit.
Figure 6B:
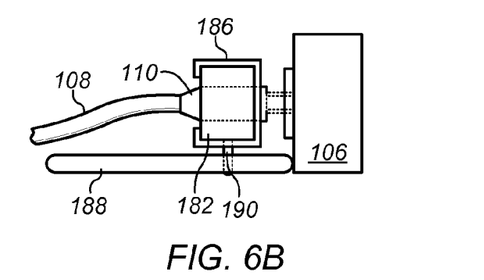

FIGS. 6A and 6B illustrate operation of a sliding plug extraction mechanism to extract one plug on a cable holder from a rack power distribution unit. To extract one of power plugs 110 from a corresponding one of power receptacles on rack power distribution unit 106, extraction lever 188 may be moved by the user such that the end of the lever bears against the front surface of the housing of rack power distribution unit 106. Slider 186 may be forced away from rack power distribution unit 106, carrying with it the portion of holder bar 182 that has connector plug 110a. Connector plug 110a may be extracted from the connector receptacle.

Since cable holder bar 182 is pliable, holder bar 182 bends between the location of connector 110a and the location of the next connector. Once connector plug 110a has been extracted, slider 186 may be moved to the next connector location and extraction device used to extract the connector plug at that location, and so on until all of the connector plugs have been extracted one after another.

Figure 7A:
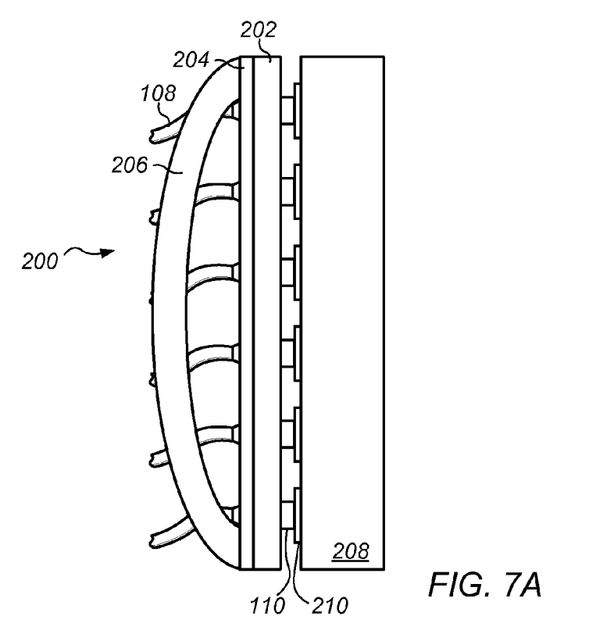
FIGS. 7A and 7B illustrate an embodiment of a cable holding system with a pliable holder and a handle that allows sequential extraction of connector plugs from a rack power distribution unit.
Figure 7B:
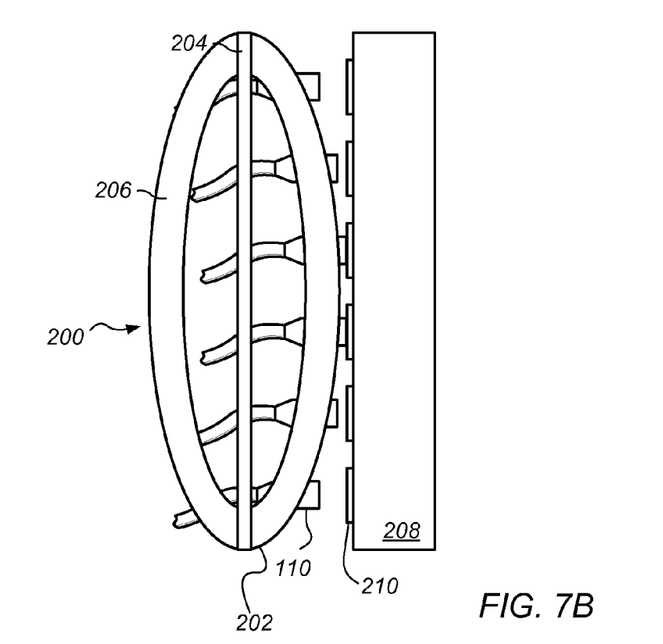

FIGS. 7A and 7B illustrate an embodiment of a cable holding system with a pliable holder and a handle that allows sequential extraction of connector plugs from a rack power distribution unit. FIG. 7A illustrates a cable holding system with a set of connector plugs fully installed in a rack power distribution unit. Cable holding system 200 includes cable plug carrier 202, plate 204, and handle 206. Cable plug carrier 202 may be made of a pliable material, such as neoprene rubber. Plate 204 may be relatively rigid (for example, a stiff steel or aluminum plate.) Handle 206 and cable plug carrier 202 may be attached to plate 204 at or near the ends of plate 204 (for example, upper end and lower end).

To install cables 108 in rack power distribution unit 208, a user may press connector plugs 110 into connector receptacles 210 by gripping handle 206 and pushing plate 204 toward connector receptacles 210 of rack power distribution unit 106. Plate 204 may force plug carrier 202 forward until each of connector plugs 110 is installed in a corresponding one of connector receptacles 210. In some embodiments, all of connector plugs 110 are simultaneously installed using cable holding system 202. In certain embodiments, plugs are installed one-by-one, or group-by-group (for example, two at a time). In one embodiment, the middle connector plugs are installed first, followed by the next pair of connector plugs nearest the middle, and so on, until the connector plugs at the ends of the holder are installed.

FIG. 7B illustrates a cable holding system is used to sequentially extract cable plugs from a rack power distribution unit. Handle 206 may be pulled away from rack power distribution 208, such that an extraction force is applied to connector plugs 110. Plug carrier 202 may bend (as illustrated, for example, in FIG. 7B).

In embodiments, plugs are extracted one after another from the ends of carrier 202 to the middle. For example, as illustrated in FIG. 7B, the connector plugs at the upper and lower ends may be extracted first, followed by the next upper and lower pair, followed by the two connector plugs at the middle of rack power distribution unit 208.

In some cases, handle 206 is used to pull on only one end of the plate 204 at a time. For example, the upper end of handle may be used to pull on the upper part of plate 204, such that the uppermost connector plug is extracted first, then the second from the top, and so on. As another example, the user may rock handle 206 to apply an extract force alternately on the upper and lower ends of plate 204. Once all connector plugs 110 on cable holding system 200 have been extracted, carrier 202 may return to its original state (for example, straight, such as shown in FIG. 7A).

Figure 8:
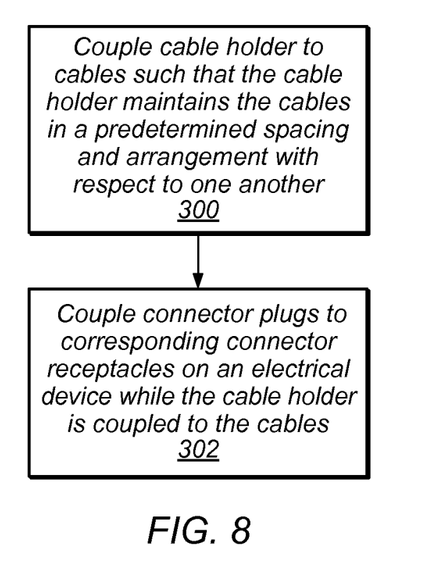
FIG. 8 illustrates one embodiment of managing connections to an electrical device using a cable holder that groups multiple connector plugs.

FIG. 8 illustrates one embodiment of managing connections to an electrical device using a cable holder that groups multiple connector plugs. At 300, a cable holder is coupled to one or more cables such that the cable holder maintains two or more portions of the cables in a predetermined spacing and arrangement with respect to one another. The predetermined spacing and arrangement matches a spacing and arrangement on a corresponding set of connector receptacles on an electrical device. In some embodiments, the cable holder maintains connector plugs at the ends of the cables in a predetermined spacing and arrangement.

In some embodiments, cable holders are used to group and order sets of connector plugs to be installed on a front panel of the electrical device. For example, one cable holder may group and order Cables 1-8, which have connector plugs are to be installed in Receptacles 1-8, respectively, a second cable holder may group and order Cables 9-16, which has connector plugs to be installed in Receptacles 9-16, and so on.

At 302, connector plugs are coupled to corresponding connector receptacles on the electrical device while the cable holder is coupled to the cables. In some embodiments, cables are removed from an electrical device while cable holders are attached to the cables. The cable holders may remain in place on the cables to maintain the grouping and ordering of the cables during service or replacement of the electrical device. Once the electrical device has been repaired or replaced, the cables may be reinstalled, group by group, using the cable holders.

Figure 9:
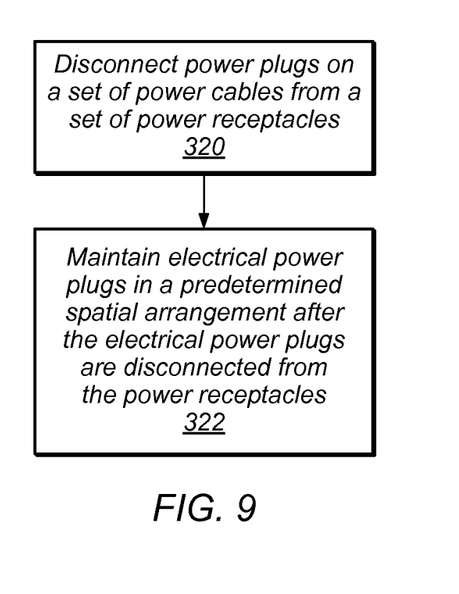
FIG. 9 illustrates a method of managing power connections that includes maintaining a spatial relationship of a set of power plugs during maintenance operations.

FIG. 9 illustrates a method of managing power connections that includes maintaining a spatial relationship of a set of power plugs during maintenance operations. At 320, electrical power plugs on a set of power cables are disconnected from a set of electrical power receptacles. The electrical power receptacles are in a fixed relationship to one another. The electrical power plugs may be in a predetermined spatial arrangement with one another when installed in the set of electrical power receptacles.

At 322, the electrical power plugs are maintained in the predetermined spatial arrangement after the electrical power plugs are disconnected from the set of electrical receptacles. The electrical device may be replaced with a replacement electrical device. The connector plugs may be installed on receptacles of the replacement device.

The various methods as illustrated in the Figures and described herein represent exemplary embodiments of methods. The order of methods may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   one or more power cables comprising a plurality of power connector plugs, wherein the power connector plugs are configured to couple to corresponding power connector receptacles of a power distribution unit, wherein the power distribution unit is configured to distribute electrical power to electrical systems, and
   one or more power cable holders coupled to at least one of the one or more power cables, wherein at least one of the power cable holders comprises:
      a plurality of cable-holding portions configured to hold at least four of the power connector plugs in a column with predetermined spacing between successive power connector plugs in the column such that the at least four power connector plugs in the column remain in a same order when removed from the corresponding power connector receptacles of the power distribution unit; and
      a power connector plug extraction mechanism configured to be operated by a user to extract the at least four of the power connector plugs from corresponding power connector receptacles of the power distribution unit.

2. The system of claim 1, further comprising a rack, wherein the power distribution unit is a rack power distribution unit in the rack.

3. The system of claim 1, wherein the at least one cable holder holds the at least four power connector plugs in a predetermined spacing and predetermined alignment with respect to one another, wherein the predetermined spacing and predetermined alignment matches a spacing and alignment of corresponding power connector receptacles on the power distribution unit.

4. The system of claim 1, wherein the at least one cable holder comprises an insertion mechanism configured to be operated by a user to install power connector plugs into corresponding power connector receptacles of the power distribution unit.

5. A power cable holder, comprising:
a holder body; and
a plurality of power cable-holding portions configured to couple with one or more cables, wherein the cable-holding portions are configured to hold four or more power plugs of the one or more cables in a column with predetermined spacing between successive power plugs in the column such that the at least four power plugs in the column remain in a same order when removed from corresponding receptacles of a power distribution unit, wherein the power plugs are configured to couple with the corresponding receptacles of the power distribution unit, and wherein the power distribution unit is configured to distribute electrical power to electrical systems.

6. The power cable holder of claim 5, wherein the power cable-holding portions comprise a clamp, wherein the clamp is removable from at least one of the power cables.

7. The power cable holder of claim 5, further comprising a power plug extraction mechanism configured to be operated by a user to extract the power plugs from corresponding power receptacles in the power distribution unit.

8. The power cable holder of claim 7, wherein the power plug extraction mechanism is configured to be operated by a user to sequentially extract the power plugs.

9. The power cable holder of claim 5, further comprising an insertion mechanism configured to be operated by a user to install the power plugs into corresponding power receptacles in the power distribution unit.

10. The power cable holder of claim 5, further comprising a cam mechanism configured to be operated by a user to extract the power plugs from corresponding power receptacles of the power distribution unit or install the power plugs into corresponding power connector receptacles of the power distribution unit, wherein operation of the cam mechanism by a user causes the cam mechanism to exert a force on one or more of the cable holding portions, wherein the force causes the cable holding portions to move towards or away from the receptacles of the power distribution unit.

11. The power cable holder of claim 5, wherein the one or more cable holders comprises a plurality of cable holders, wherein each of at least two of the cable holders is configured to maintain a spacing of a different set of power connector plugs coupled to power connector receptacles of the power distribution unit.

12. The power cable holder of claim 5, wherein the cable holder comprises two or more slots, wherein each of at least two of the slots is configured to receive at least a portion of a power cable.

13. The power cable holder of claim 5, wherein the spacing between at least two of the power connector plugs in the power cable holder is adjustable by a user.

14. The power cable holder of claim 5, wherein at least a portion of the holder body is constructed with a pliable material.

15. The power cable holder of claim 5, further comprising one or more labels configured to identify one or more of the power connector plugs or one or more of the cables.

16. A method of managing power connections, comprising:
disconnecting a column of at least four power connector plugs on a set of power cables from a set of power connector receptacles of a power distribution unit, wherein the at least four power connector plugs are in a predetermined spatial arrangement with one another when installed in the set of power connector receptacles, and wherein the power distribution unit is configured to distribute electrical power to electrical systems via the set of power cables; and
maintaining the at least four power connector plugs in the predetermined spatial arrangement after the power connector plugs are disconnected from the set of power connector receptacles of the power distribution unit.

17. The method of claim 16, wherein the set of power connector receptacles are on a power distribution unit.

18. The method of claim 16, wherein the set of power connector receptacles are on one or more electrical devices, further comprising:
replacing at least one of the one or more electrical devices with a replacement electrical device; and
installing the column of at least four power connector plugs in a corresponding set of power connector receptacles, wherein the corresponding set of power connector receptacles includes at least one power connector receptacle on the replacement electrical device.

19. The method of claim 16, wherein disconnecting the power connector plugs comprises simultaneously disconnecting at least four of the power connector plugs coupled to a cable holder.

20. The method of claim 16, wherein disconnecting the power connector plugs comprises sequentially disconnecting at least four of the power connector plugs coupled to a cable holder.

* * * * *